(12) United States Patent
Lin

(10) Patent No.: US 11,297,734 B2
(45) Date of Patent: Apr. 5, 2022

(54) HEAT DISSIPATION MODULE FOR OPTICAL TRANSCEIVER

(71) Applicant: Delta Electronics, Inc., Taoyuan (TW)

(72) Inventor: Yu-Hsien Lin, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/916,938

(22) Filed: Jun. 30, 2020

(65) Prior Publication Data

US 2021/0007243 A1 Jan. 7, 2021

Related U.S. Application Data

(60) Provisional application No. 62/869,122, filed on Jul. 1, 2019.

(30) Foreign Application Priority Data

Apr. 10, 2020 (CN) .......................... 202010276542.7

(51) Int. Cl.
| | |
|---|---|
| *H05K 7/20* | (2006.01) |
| *H04B 10/40* | (2013.01) |
| *H05K 5/02* | (2006.01) |
| *H04B 10/25* | (2013.01) |

(52) U.S. Cl.
CPC ......... *H05K 7/20218* (2013.01); *H04B 10/25* (2013.01); *H04B 10/40* (2013.01); *H05K 5/0217* (2013.01)

(58) Field of Classification Search
CPC .................................................. H05K 7/20218
See application file for complete search history.

(56) References Cited

U.S. PATENT DOCUMENTS

| | | | |
|---|---|---|---|
| 10,856,446 B2* | 12/2020 | Boyden .............. | H05K 7/20772 |
| 2012/0133467 A1* | 5/2012 | Salomaki ................ | H01F 27/10 |
| | | | 336/60 |
| 2013/0027870 A1* | 1/2013 | Goldran ................ | H01L 23/467 |
| | | | 361/679.32 |

(Continued)

FOREIGN PATENT DOCUMENTS

| | | |
|---|---|---|
| CN | 102448277 A | 5/2012 |
| CN | 102612302 A | 7/2012 |

(Continued)

*Primary Examiner* — Stephen S Sul
*Assistant Examiner* — Alexander Ryan Horton
(74) *Attorney, Agent, or Firm* — Kirton McConkie; Evan. R. Witt

(57) ABSTRACT

A heat dissipation module for optical transceiver is provided. The heat dissipation module for optical transceiver includes a liquid cooling device, a casing assembly and an elastic fastener. The liquid cooling device includes a liquid cooling tube and a base, and the liquid cooling tube is in connection with the base. The casing assembly includes a top plate. The top plate includes a top surface, a bottom surface and an opening. The opening is through the top surface and the bottom surface. At least one part of the liquid cooling device is extended into the opening and protruded over the bottom surface. The elastic fastener is configured for fastening the liquid cooling device on the casing assembly, and the liquid cooling device is pluggably fastened to the casing assembly.

17 Claims, 12 Drawing Sheets

(56) References Cited

U.S. PATENT DOCUMENTS

| | | | | |
|---|---|---|---|---|
| 2014/0160679 A1* | 6/2014 | Kelty | ............... | G02B 6/4269 |
| | | | | 361/700 |
| 2015/0077937 A1* | 3/2015 | Daly | ................. | G02B 6/428 |
| | | | | 361/700 |
| 2016/0197424 A1* | 7/2016 | L'Esperance | ........ | G02B 6/4269 |
| | | | | 439/61 |
| 2017/0135246 A1* | 5/2017 | Lunsman | ........... | H05K 7/20263 |
| 2019/0045656 A1 | 2/2019 | Chen et al. | | |
| 2020/0006884 A1* | 1/2020 | Weltsch | ............. | H05K 7/20272 |
| 2020/0142142 A1* | 5/2020 | Luo | ..................... | H01R 13/641 |

FOREIGN PATENT DOCUMENTS

| | | |
|---|---|---|
| CN | 106764975 A | 5/2017 |
| CN | 207318799 U | 5/2018 |
| CN | 108919438 A | 11/2018 |

\* cited by examiner

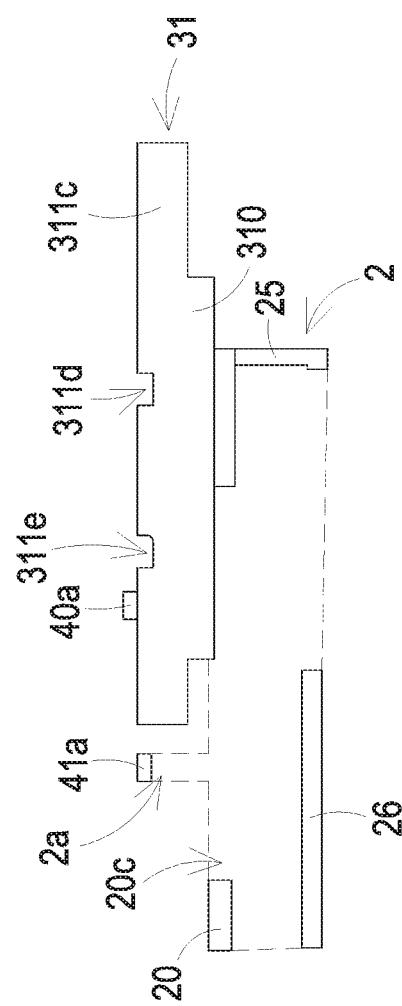

HEAT DISSIPATION MODULE FOR OPTICAL TRANSCEIVER

CROSS-REFERENCE TO RELATED APPLICATION

This application claims the benefit of U.S. Provisional Application No. 62/869,122 filed on Jul. 1, 2019, and entitled "LIQUID COOLING SYSTEM FOR QUAD SMALL FORM-FACTOR PLUGGABLE OPTICAL TRANSCEIVER MODULE". This application claims priority to China Patent Application No. 202010276542.7, filed on Apr. 10, 2020. The entireties of the above-mentioned patent applications are incorporated herein by reference for all purposes.

FIELD OF THE INVENTION

The present disclosure relates to a heat dissipation apparatus, and more particularly to a heat dissipation module for optical transceiver.

BACKGROUND OF THE INVENTION

Optoelectronic communication products, such as hubs and other network devices, usually include at least one optical transceiver for converting optical signals into electrical signals. An optical fiber can be connected to a network device through the optical transceiver. In recent years, among the optical fiber products, the Gigabit Interface Converter (GBIC) optical transceiver has been gradually replaced by a Small Form-factor (SFF) optical transceiver, and further improved to a small form-factor pluggable (SFP) optical transceiver or a quad small form-factor pluggable (QSFP) optical transceiver.

The optical transceiver is employed for receiving the optical signal transmitted by the optical fiber and converting the optical signal into an electrical signal, which may generate extremely high thermal energy in the process. If the thermal energy cannot be removed, it will cause the accelerate aging or damage of the optical transceiver and other components installed in the electronic equipment. Conventional optical transceivers mainly dissipate heat by means of air-cooling, such as heat dissipation devices or cooling fans. However, due to the low heat dissipating efficiency of air, the air-cooling heat dissipation has a limited effect of removing heat, which results in the disadvantage of poor heat dissipation.

Some of the conventional optical transceivers use a liquid cooling device to dissipate heat, wherein the liquid cooling device is fixed on the casing of the optical transceiver by welding. However, the welding process is time-consuming and requires additional tools or manual assistance to assemble the optical transceiver and liquid cooling device, resulting in the disadvantage of difficult installation. In addition, the conventional liquid cooling device is welded on the casing of the optical transceivers, so that the thermal energy generated inside the optical transceiver have to be transferred to the liquid cooling device through the casing. Since the casing blocks the heat dissipation from the liquid cooling device, which results in poor heat dissipation effect.

Therefore, there is a need of providing a heat dissipation module for optical transceiver to obviate the drawbacks encountered from the prior arts.

SUMMARY OF THE INVENTION

It is an objective of the present disclosure to provide a heat dissipation module for optical transceiver to achieve the advantages of enhancing heat dissipating effect and improving the convenience of installation.

In accordance with an aspect of the present disclosure, there is provided a heat dissipation module for optical transceiver. The heat dissipation module for optical transceiver includes a liquid cooling device, a casing assembly and an elastic fastener. The liquid cooling device includes a liquid cooling tube and a base, the liquid cooling tube is in connection with the base. The casing assembly includes a top plate, the top plate includes a top surface, a bottom surface and an opening. The opening is through the top surface and the bottom surface. At least one part of the liquid cooling device is extended into the opening and protruded over the bottom surface. The elastic fastener is configured for fastening the liquid cooling device on the casing assembly. The liquid cooling device is pluggably fastened to the casing assembly.

In accordance with another aspect of the present disclosure, there is provided a heat dissipation module for optical transceiver. The heat dissipation module for optical transceiver includes a liquid cooling device, a casing assembly and an elastic fastener. The liquid cooling device includes a liquid cooling tube and a base. The liquid cooling tube is in connection with the base. The casing assembly includes a top plate. The top plate includes a top surface, a bottom surface and an opening. The opening is through the top surface and the bottom surface. At least one part of the liquid cooling device is extended into the opening and protruded over the bottom surface. A part of an end of the elastic fastener is extended to the liquid cooling device, so as to fasten the liquid cooling device on the casing assembly.

In accordance with the other aspect of the present disclosure, there is provided a heat dissipation module for optical transceiver. The heat dissipation module for optical transceiver includes a heat dissipation device, a casing assembly and an elastic fastener. The casing assembly includes a top plate. The top plate includes a top surface, a bottom surface and an opening. The opening is through the top surface and the bottom surface. At least one part of the heat dissipation device is extended into the opening and protruded over the bottom surface. The heat dissipation device is pluggably fastened to the casing assembly.

BRIEF DESCRIPTION OF THE DRAWINGS

FIGS. 6B to 6E are schematic perspective views illustrating the assembling steps of the liquid cooling device and the casing assembly of heat dissipation module for optical transceiver of FIG. 6A;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
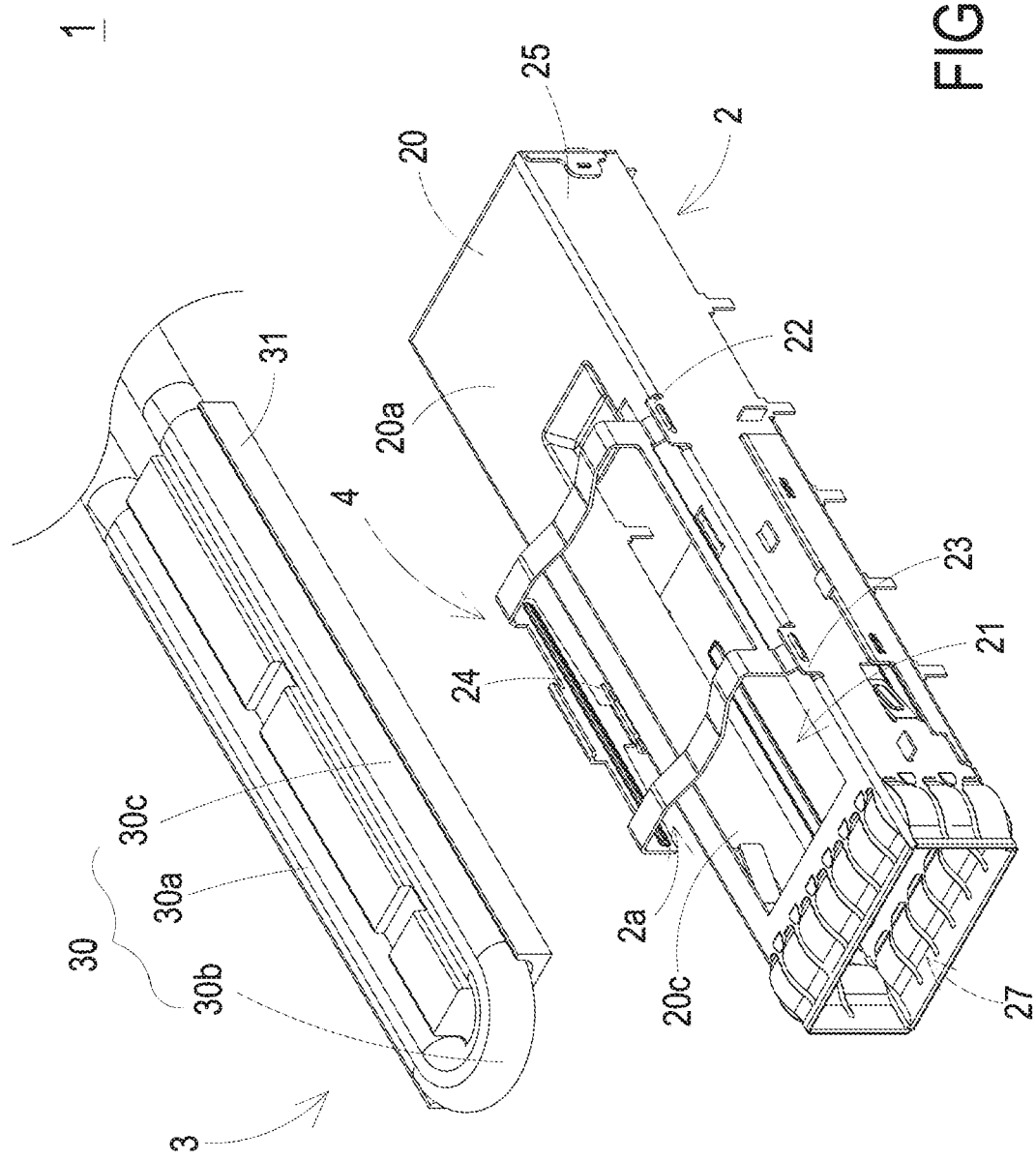
FIG. 1 is a schematic perspective view illustrating a liquid cooling device and a casing assembly of a heat dissipation module for optical transceiver according to a first embodiment of the present disclosure.
Figure 2:
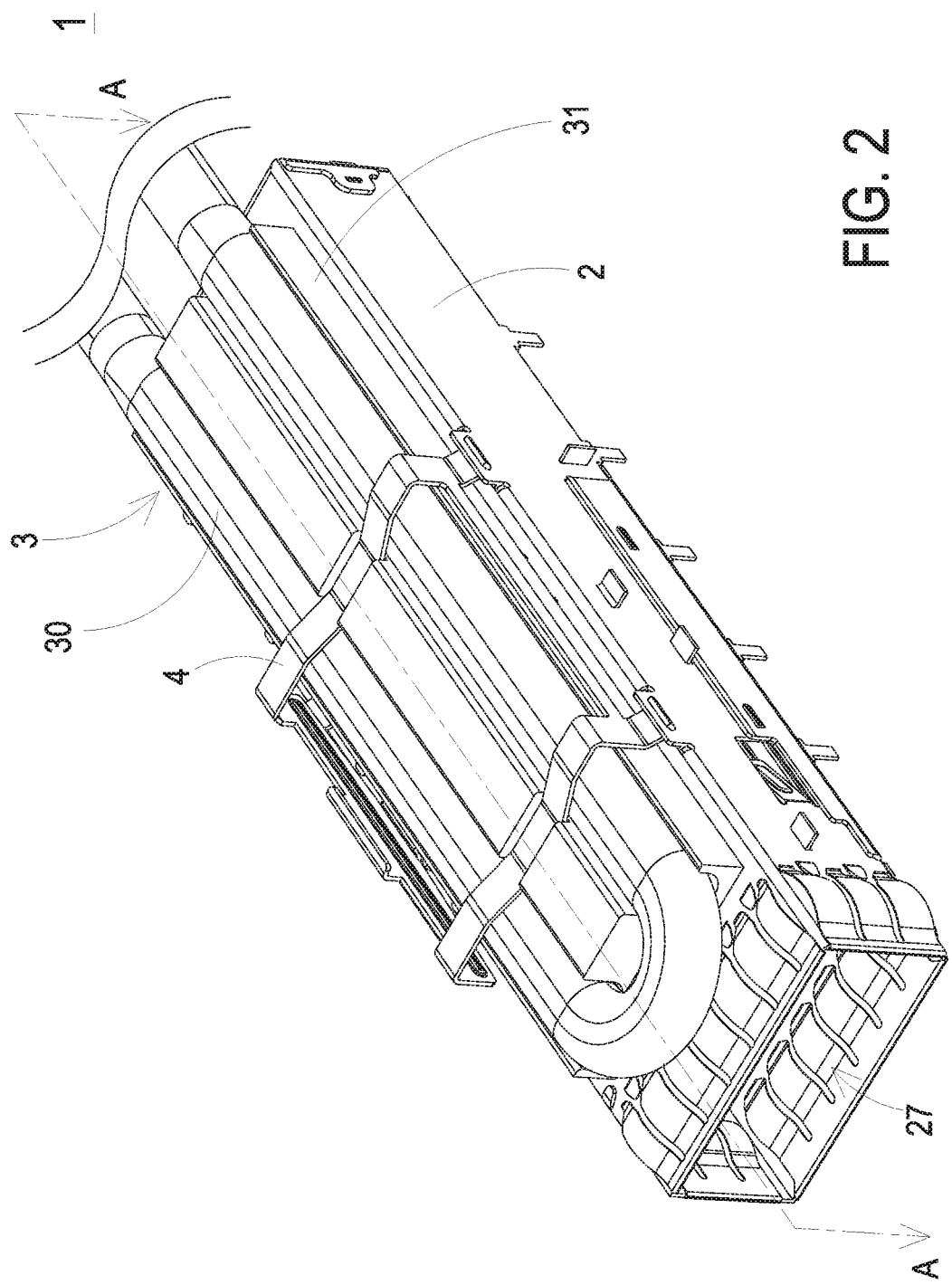
FIG. 2 is a schematic perspective view illustrating the heat dissipation module for optical transceiver according to the first embodiment of the present disclosure.

Please refer to FIGS. 1 and 2. FIG. 1 is a schematic perspective view illustrating a liquid cooling device and a casing assembly of a heat dissipation module for optical transceiver according to a first embodiment of the present disclosure, FIG. 2 is a schematic perspective view illustrating the heat dissipation module for optical transceiver according to the first embodiment of the present disclosure. The first embodiment of the heat dissipation module for optical transceiver 1 includes a casing assembly 2, a liquid cooling device 3 and an elastic fastener 4. The liquid cooling device 3 includes a liquid cooling tube 30 and a base 31, the liquid cooling tube 30 is in connection with the base 31. Please refer to FIG. 4, the casing assembly 2 includes a top plate 20. The top plate 20 includes a top surface 20*a*, a bottom surface 20*b* and an opening 20*c*. The opening 20*c* is through the top surface 20*a* and the bottom surface 20*b*. At least one part of the liquid cooling device 3 is extended into the opening 20*c* and protruded over the bottom surface 20*b*. The elastic fastener 4 is employed for fastening the liquid cooling device 3 on the casing assembly 2, and the liquid cooling device 3 is pluggably fastened to the casing assembly 2 in a pluggable manner. The pluggable manner means that the liquid cooling device 3 can be inserted into or pulled off the casing assembly 2 without removing the elastic fastener 4.

Please refer to FIGS. 1 and 2 again. The casing assembly 2 of the present disclosure may be composed of multiple components or an integrated casing structure. The casing assembly 2 of the first embodiment of the present disclosure includes a top plate 20, a plurality of side plates 25, a bottom plate 26 and an accommodating portion 21. The top plate 20, the plurality of side plates 25 and the bottom plate 26 are connected and assembled to each other, so as to define the accommodating portion 21 therewithin. A casing opening 27 is defined on a side of the casing assembly 2, wherein the casing opening 27 is in fluid communication with the accommodating portion 21. The top plate 20 includes the opening 20*c*, and the opening 20*c* is in fluid communication with the accommodating portion 21. An electronic component or an optical component (not shown in figures) may be accommodated in the accommodating portion 21. In some embodiments, an optical plug (not shown in figures) may be plugged into the accommodating portion 21 through the casing opening 27, and the optical plug is electrically coupled to the electronic component or the optical component inside the accommodating portion 21.

Figure 3A:
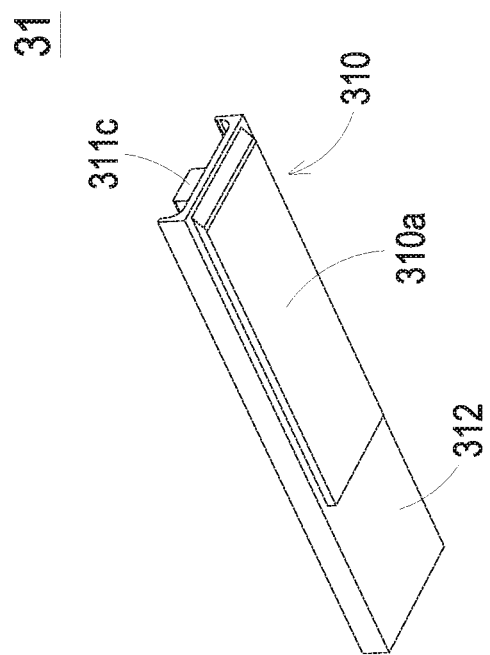
FIG. 3A is a schematic top view illustrating a base of the liquid cooling device of FIG. 1.
Figure 3B:
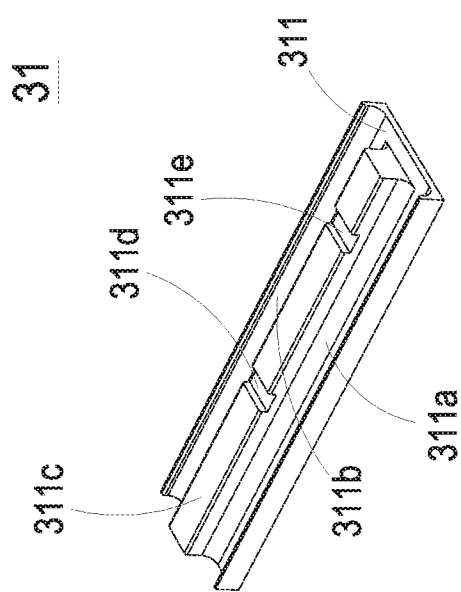
FIG. 3B is a schematic rear view illustrating the base of the liquid cooling device of FIG. 3A.

Please refer to FIGS. 3A and 3B. FIG. 3A is a schematic top view illustrating a base of the liquid cooling device of FIG. 1, and FIG. 3B is a schematic rearview illustrating the base of the liquid cooling device of FIG. 3A. The base 31 of the liquid cooling device 3 of this embodiment is composed of multiple components or an integrated structure. The base 31 of this embodiment has an upper surface 311 and a lower surface 312 corresponding to each other. The base 31 includes a protrusion 310. The protrusion 310 protrudes from the lower surface 312 of the base 31. In this embodiment, a first accommodating slot 311*a* and a second accommodating slot 311*b* are disposed on the upper surface 311 of the base 31 for accommodating the liquid cooling tube 30. The protrusion 310 is disposed on the lower surface 312 and has a protrusion surface 310*a*. In some embodiments, the protrusion 310 and the base 31 may be but not limited to an integrally structure. In this embodiment, the outer contour of the protrusion 310 may be corresponded to the opening 20*c* of the top plate 20, but not limited thereto.

Figure 4:
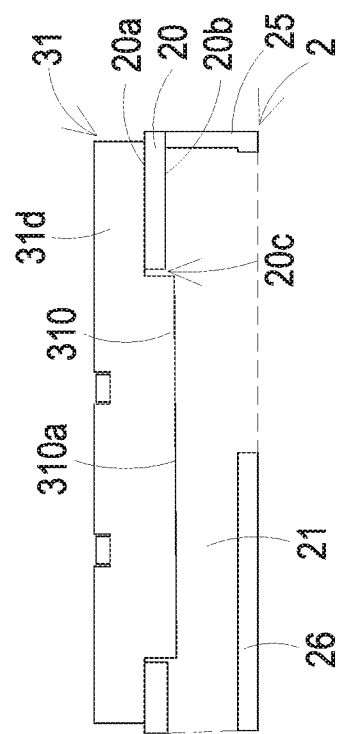
FIG. 4 is a schematic cross-sectional view illustrating the heat dissipation module for optical transceiver of FIG. 2 and taken along the line A-A.

Please refer to FIGS. 1, 2 and 4. FIG. 4 is a schematic cross-sectional view illustrating the heat dissipation module for optical transceiver of FIG. 2 and taken along the line A-A. In this embodiment, the elastic fastener 4 is fixedly arranged on the casing assembly 2, wherein a part of an end of the elastic fastener 4, such as a fixing part, is disposed between the casing assembly 2 and the liquid cooling device 3. An accommodating space 2*a* is formed between the elastic fastener 4 and the top surface 20*a* of the top plate 20, and the accommodating space 2*a* is used for accommodating the liquid cooling device 3. When the elastic fastener 4 is fastened to the liquid cooling device 3, the liquid cooling tube 30 is disposed between the elastic fastener 4 and the base 31, and the elastic fastener 4 is apart from the liquid cooling tube 30. In an embodiment, the elastic fastener 4 may be fixedly disposed on the liquid cooling device 3. In another embodiment, the elastic fastener 4 may be an independent element, and is removable from the casing assembly 2 or the liquid cooling device 3, wherein the assembled types between the elastic fastener 4 and the casing assembly 2/or the cooling device 3 are not limited to the above embodiments, and can be adjusted according the practical requirements. When the elastic fastener 4 is fixed to the liquid cooling device 3, the pluggable manner of the cooling device 3 at this time means that the elastic fastener 4 and the liquid cooling device 3 can be inserted into or pulled off the accommodating space 2*a* of the casing assembly 2 along the long axis direction of the casing assembly 2.

Please refer to FIG. 4 again. When the liquid cooling device 3 is plugged into the accommodating space 2*a* of the casing assembly 2, the protrusion 310 of the base 31 is inserted into the opening 20*c* correspondingly, and the protrusion surface 310*a* of the protrusion 310 is protruded over the lower surface 20*b* of the top plate 20. In this embodiment, a thermal conductive adhesive (not shown in figures) may be coated on the protrusion surface 310*a*, but not limited thereto. Since the protrusion 310 of the base 31 is inserted into the opening 20c of the casing assembly 2 and protruded over the lower surface 20b, an electronic component (not shown in figures) inside the casing assembly 2 can be in contact with the liquid cooling device 3 through the thermal conductive adhesive, so that the heat dissipation effect can be improved. In some embodiments, the base 31 and the protrusion 310 may be made of a metal material with better thermal conductivity, for example but not limited to be a copper material. Since the protrusion 310 of the base 31 is in contact with the electronic component directly or indirectly, the thermal energy of the electronic component is transferred to the liquid cooling tube 30 rapidly, so as to enhance the heat dissipating efficacy. In addition, the liquid cooling device 3 is pluggably fastened to the casing assembly 2 by the elastic fastener 4 in a pluggable manner, therefore, the disadvantages of time-consuming and requiring additional tools or manual assistance during the welding process can be avoided, and the convenience of installation is improved.

Please refer to FIG. 1. In the first embodiment of the present disclosure, the liquid cooling tube 30 of the liquid cooling device 3 includes a first linear part 30a, a curved part 30b and a second linear part 30c. The curved part 30b is connected between the first linear part 30a and the second linear part 30c. The first linear part 30a and the second linear part 30c are parallel to each other. As shown in FIG. 3A, the base 31 of the liquid cooling device 3 includes a partition 311c, a first accommodating slot 311a and a second accommodating slot 311b disposed on the upper surface 311. The partition 311c is disposed between the first accommodating slot 311a and the second accommodating slot 311b. The first linear part 30a and the second linear part 30c of the liquid cooling tube 30 are respectively disposed in the first accommodating slot 311a and the second accommodating slot 311b, so that the liquid cooling tube 30 is positioned on the base 31. Therefore, the displacement or falling of the liquid cooling tube 30 in assembling process can be avoided, and the convenience of installation is improved.

Figure 5B:
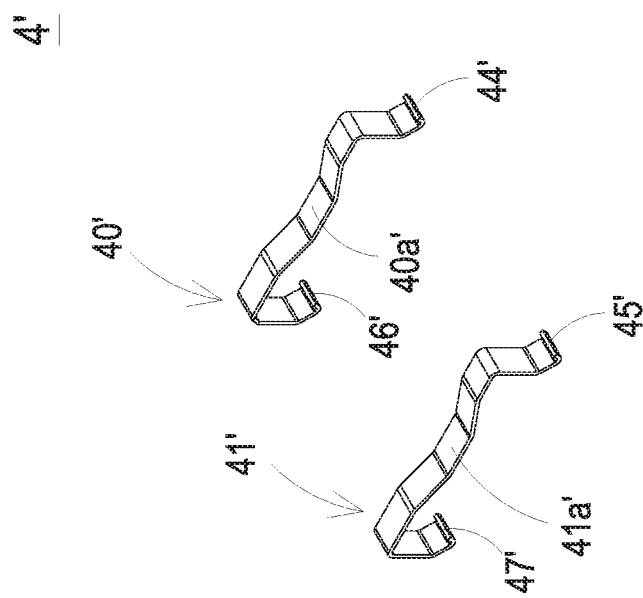
FIG. 5B is a schematic perspective view illustrating an elastic fastener of the heat dissipation module for optical transceiver according to another embodiment of the present disclosure.
Figure 5A:
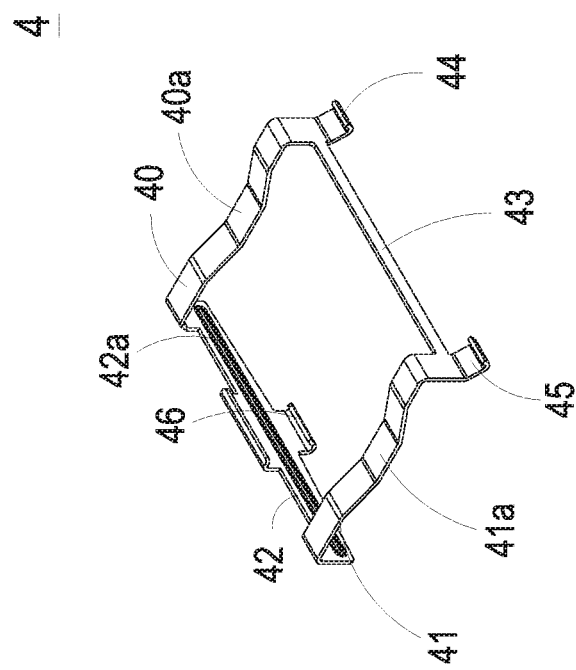
FIG. 5A is a schematic perspective view illustrating an elastic fastener of the heat dissipation module for optical transceiver of FIG. 1.

Please refer to FIGS. 1, 3A and 5A. FIG. 5A is a schematic perspective view illustrating an elastic fastener of the heat dissipation module for optical transceiver of FIG. 1. In the first embodiment of the present disclosure, the elastic fastener 4 may be a frame-shaped structure, but not limited thereto. The elastic fastener 4 includes a first arm 40, a second arm 41, a third arm 42 and a fourth arm 43. The two ends of the third arm 42 are respectively connected with a first end of the first arm 40 and a first end of the second arm 41. The two ends of the fourth arm 43 are respectively connected with a second end of the first arm 40 and a second end of the second arm 41. Since the first arm 40, the second arm 41, the third arm 42 and the fourth arm 43 are connected to each other, the elastic fastener 4 is formed as an integrated frame structure in one piece. In this embodiment, the first arm 40 includes a first downwardly-curved portion 40a, wherein the first downwardly-curved portion 40a is an elastic bended part of the first arm 40. The second arm 41 also includes a second downwardly-curved portion 41a, and the second downwardly-curved portion 41a is an elastic bended part of the second arm 41. As shown in FIG. 3A, the partition 311c of the base 31 further includes a first positioning recess 311d and a second positioning recess 311e, the first positioning recess 311d and the second positioning recess 311e are respectively arranged across the partition 311c, wherein the number and installation location of the positioning recesses are not limited to the above embodiments, and can be adjusted according to the practical requirements. When the elastic fastener 4 is assembled with the liquid cooling device 3, the first downwardly-curved portion 40 of the first arm 40 of the elastic fastener 4 is correspondingly disposed within the first positioning recess 311d of the base 31. The second downwardly-curved portion 41 of the second arm 41 of the elastic fastener 4 is also correspondingly disposed within the second positioning recess 311e of the base 31. Since the elastic fastener 4 is positioned by the first positioning recess 311d and the second positioning recess 311e, the displacement or deformation of the elastic fastener 4 during the assembling process can be avoided, and the risk of collision between the elastic fastener 4 and the liquid cooling tube 30 can also be avoided. Consequently, the convenience of installation is enhanced.

Please refer to FIG. 5A again. In this embodiment, the third arm 42 further includes a stiffener 42a. The stiffener 42a protrudes outward from an inner surface of the third arm 42, so as to enhance the structural strength of the third arm 42, reduce the risk of displacement or deformation of the third arm 42 during the assembling process. Consequently, the convenience of installation is enhanced. In some embodiments, the fourth arm 43 may also include a stiffener (not shown in figures), but not limited thereto.

As shown in FIG. 5A, in the first embodiment, the elastic fastener 4 further includes a first fixing part 44, a second fixing part 45 and a third fixing part 46. The first fixing part 44, the second fixing part 45 and the third fixing part 46 are used for detachably installing the elastic fastener 4 on the casing assembly 2. The first fixing part 44, the second fixing part 45 and the third fixing part 46 may be a hook structure respectively, but not limited thereto. In this embodiment, the first fixing part 44 is disposed on the connection portion of the first arm 40 and the fourth arm 43. The second fixing part 45 is disposed on the connection portion of the second arm 41 and the fourth arm 43. Moreover, the third fixing part 46 is disposed below the third arm 42. As shown in FIG. 1, the casing assembly 2 of the first embodiment of the present disclosure further includes a first buckling element 22, a second buckling element 23 and a third buckling element 24. The first buckling element 22, the second buckling element 23 and the third buckling element 24 are ear-shaped structures extended upwardly form the side plates 25 of the casing assembly 2 and respectively include an opening penetrating through the ear-shaped structure.

In this embodiment, the hook structures of the first fixing part 44, the second fixing part 45 and the third fixing part 46 are respectively and correspondingly hooked into the openings of the first buckling element 22, the second buckling element 23 and the third buckling element 24. The fixing structures or the fixing methods are not limited to the above embodiments, and can be adjusted according to the practical requirements. In the embodiment, the first fixing part 44 is positioned and fixed on the first buckling element 22 correspondingly, the second fixing part 45 is positioned and fixed on the second buckling element 23 correspondingly, and the third fixing part 46 is positioned and fixed on the third buckling element 24 correspondingly. Accordingly, a part of the end of the elastic fastener 4, such as the first fixing part 44, the second fixing part 45 and the third fixing part 46, is disposed between the liquid cooling device 3 and the casing assembly 2, whereby the liquid cooling device 3 is fixed to the casing assembly 2 in the pluggable manner. Consequently, the disadvantages of time-consuming and requiring manual assistance of the welding process can be avoided, and the convenience of installation is improved.

Please refer to FIG. 5B. FIG. 5B is a schematic perspective view illustrating an elastic fastener of the heat dissipation module for optical transceiver according to another embodiment of the present disclosure. In this embodiment, the structure of the elastic fastener 4' is similar to the structure of the elastic fixing member 4 shown in FIG. 5A. The difference from the elastic fixing member 4 shown in FIG. 5A is that the elastic fixing member 4' is not a frame structure. As shown in FIG. 5B, the elastic fixing member 4' only includes a first arm 40' and a second arm 41'. The first arm 40' and the second arm 41' are respectively two independent elastic structures. The first arm 40' includes a first downwardly-curved portion 40a', a first fixing part 44' and a third fixing part 46'. The first downwardly-curved portion 40a' is an elastic bended part of the first arm 40', and the first fixing part 44' and the third fixing part 46' are respectively disposed on two ends of the first arm 40'. The second arm 41' includes a second downwardly-curved portion 41a', a second fixing part 45' and a fourth fixing part 47'. The second downwardly-curved portion 41a' is an elastic bended part of the second arm 41', and the second fixing part 45' and the fourth fixing part 47' are respectively disposed on two ends of the second arm 41'. The first arm 40' and the second arm 41' of the elastic fixing member 4' are used for correspondingly fastening to the casing assembly 2. Similar to the previous embodiment, the casing assembly 2 has a plurality of the buckling elements (not shown in figures) disposed correspondingly to first fixing part 44', the second fixing part 45', the third fixing part 46' and the fourth fixing part 47'. The fixing methods are also similar to that of the previous embodiment and are not redundantly described hereinafter. In this embodiment, the first downwardly-curved portion 40a' of the first arm 40' and the second downwardly-curved portion 41a' of the second arm 41' are respectively and correspondingly positioned on the first positioning recess 311d and the second positioning recess 311e of the base 31. Consequently, the displacement or deformation of the elastic fastener 4' during the assembling process can be avoided, the risk of collision between the elastic fastener 4' and the liquid cooling tube can be avoided, and the convenience of installation is enhanced. In other embodiments, the number and the installation positions of the arms and the buckling elements of the elastic fastener 4' are not limited to the above embodiments, and can be adjusted according to the practical requirements.

Figure 6A:
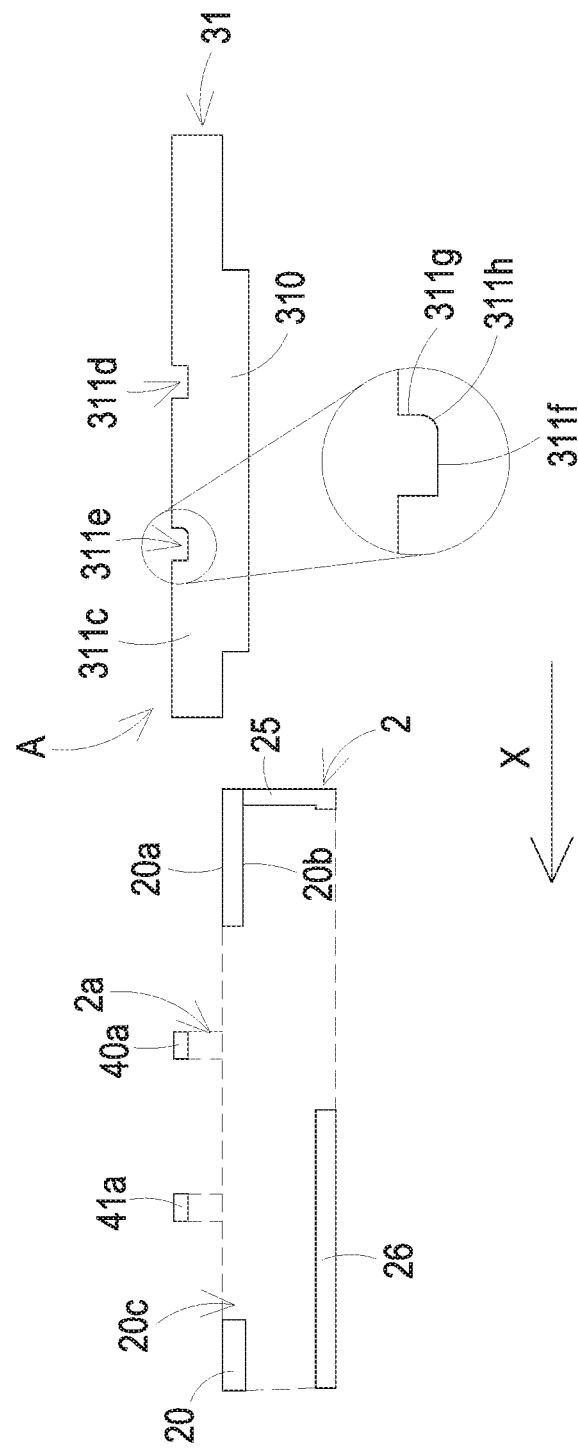
FIG. 6A is a schematic cross-sectional and partially enlarged view illustrating the liquid cooling device and the casing assembly of the heat dissipation module for optical transceiver of FIG. 2.
Figure 6C:
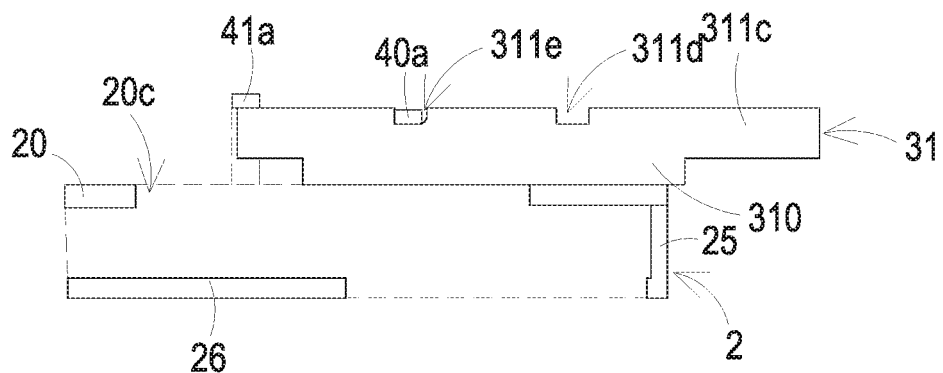
Figure 6D:
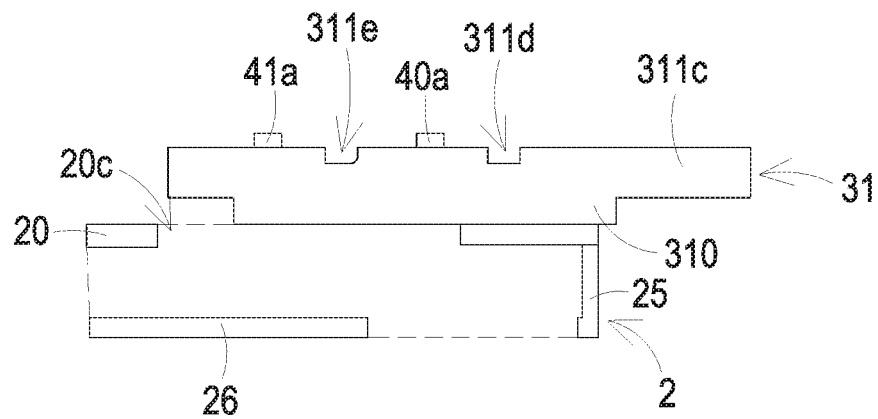
Figure 6E:
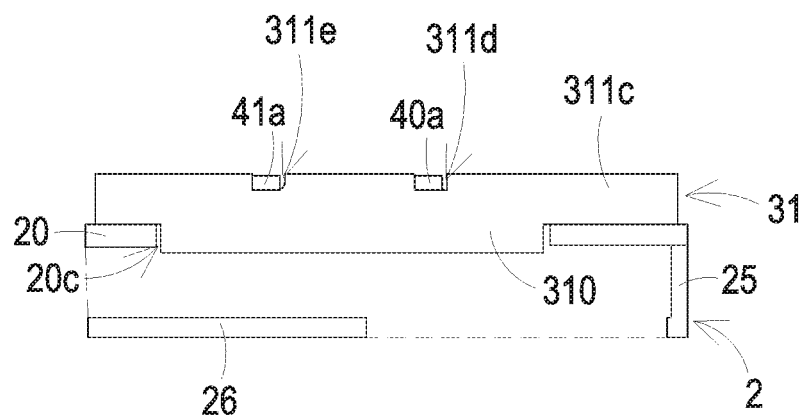

The assembling processes of the liquid cooling device 3 of the heat dissipation module for the optical transceiver 1 of the first embodiment are described in details as follows. Please refer to FIG. 6A, first, aligning a front portion A of the liquid cooling device 3 to the accommodating space 2a of the casing assembly 2, and sliding the liquid cooling device 3 toward the accommodating space 2a along the top surface 20a in the direction X as shown in the arrow. Then, please refer to FIG. 6B, when the partition 311c of the base 31 of the liquid cooling device 3 abuts against the first downwardly-curved portion 40a of the first arm 40, the first downwardly-curved portion 40a is elastically deformed against the partition 311c, so that the first downwardly-curved portion 40a is pushed up by the partition wall 311c. Meanwhile, the liquid cooling device 3 continuously slides toward the accommodating space 2a along the direction X. Please refer to FIG. 6C, when the first downwardly-curved portion 40a is elastically engaged with the second positioning recess 311e of the base 31, a pushing force is provided continuously. Accordingly, the first downwardly-curved portion 40a is pushed up again by the partition 311c, and the liquid cooling device 3 is slid forwardly. Please refer to FIG. 6D, when the partition 311c of the liquid cooling device 3 abuts against the second downwardly-curved portion 41a of the second arm 41, the second downwardly-curved portion 41a is elastically deformed against the partition 311c, so that the second downwardly-curved portion 41a is pushed up by the partition wall 311c. Finally, please refer to FIG. 6E, since the pushing force is continuously provided, the liquid cooling device 3 slides continuously until the first downwardly-curved portion 40a and the second downwardly-curved portion 41a are respectively engaged with the first positioning recess 311d and the second positioning recess 311e. Consequently, the elastic fastener 4 is positioned and fixed on the base 31, in the meantime, the protrusion 310 of the base 31 is disposed within the opening 20c of the top plate 20 correspondingly. Due to the liquid cooling device 3 is fastened on the casing assembly 2 by the elastic fastener 4 in a pluggable manner, the disadvantages of time-consuming and requiring manual assistance of the welding process can be avoided, and the convenience of installation is improved.

Please refer to FIG. 6A again. In the first embodiment, the second positioning recess 311e of the base 31 further includes a recess bottom surface 311f, a side surface 311g and an arc side 311h. The recess bottom surface 311f is a surface on the bottom of the second positioning recess 311e. The side surface 311g is a surface disposed inside the second positioning recess 311e, perpendicular to the recess bottom surface 311f and opposite to the sliding direction of the liquid cooling device 3 while assembling. The arc side 311h is an arc-shaped side connected between the recess bottom surface 311f and the side surface 311g. When the first downwardly-curved portion 40a is pushed up from the second positioning recess 311e, the first downwardly-curved portion 40a moves upwardly along the arc curve of the arc side 311h, so as to be easily moved out of the second positioning recess 311e. Consequently, the first downwardly-curved portion 40a can be pushed up from the second positioning recess 311e more easily, and the damage caused by the excessive deformation of the first arm 40 can be avoided.

Figure 7:
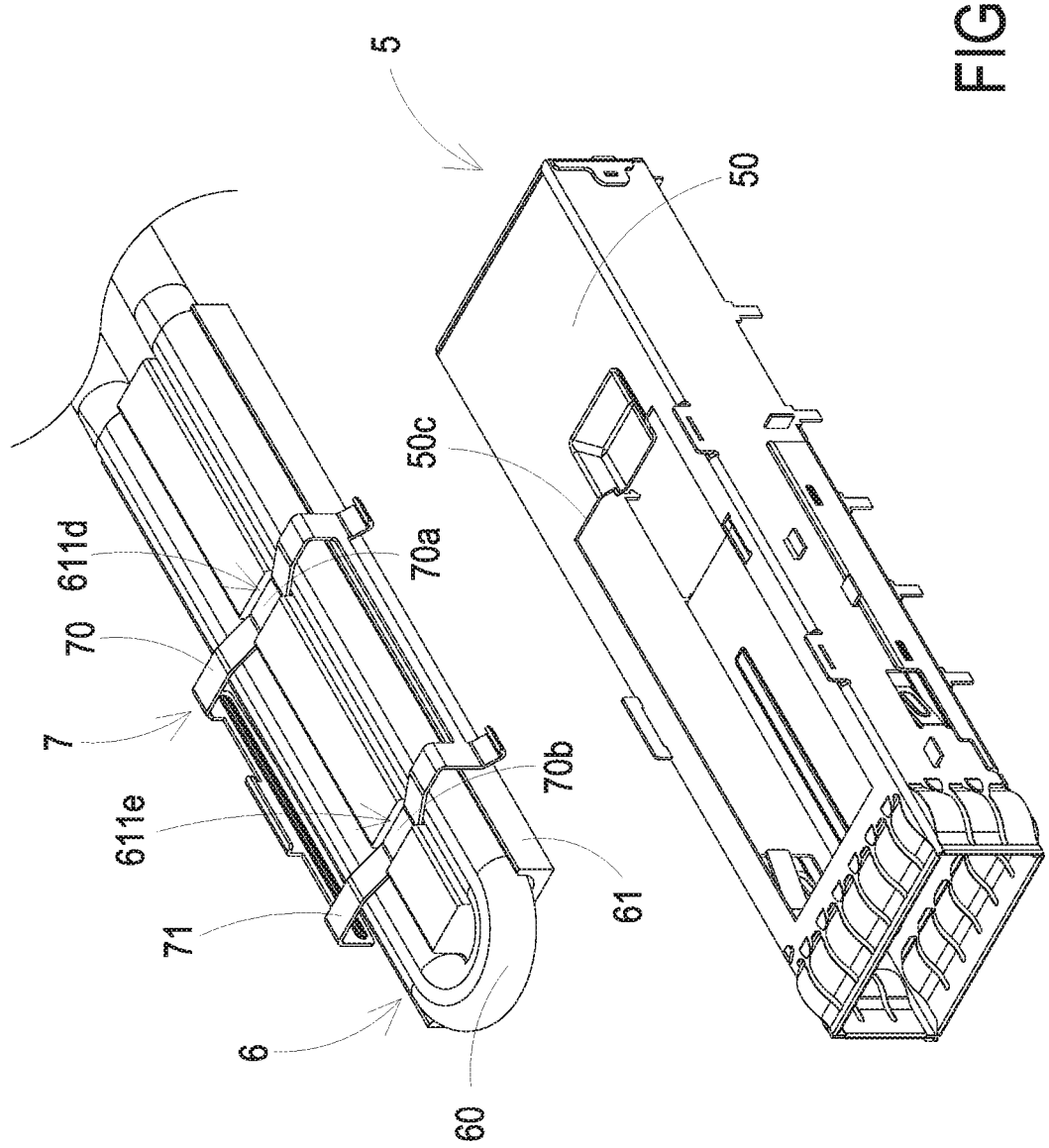
FIG. 7 is a schematic perspective view illustrating a liquid cooling device and a casing assembly of a heat dissipation module for optical transceiver according to a second embodiment of the present disclosure.

Please refer to FIG. 7. FIG. 7 is a schematic perspective view illustrating a liquid cooling device and a casing assembly of a heat dissipation module for optical transceiver according to a second embodiment of the present disclosure. In this second embodiment, the heat dissipation module for optical transceiver 1a also includes a casing assembly 5, a liquid cooling device 6 and an elastic fastener 7, which are structurally similar to that of the first embodiment, and are not redundantly described hereinafter. The difference from the first embodiment of FIG. 1 is that the elastic fastener 7 of the heat dissipation module for optical transceiver 1a of the second embodiment is fixedly mounted on the liquid cooling device 6. More specifically, the first downwardly-curved portion 70a of the first arm 70 is fixedly mounted on the first positioning recess 611d of the base 61. The second downwardly-curved portion 71a of the second arm 71 is also fixedly mounted on the second positioning recess 611e of the base 61. In other words, the elastic fastener 7 of the second embodiment is stationary with respect to the base 61, while an accommodating space is still defined therebetween for accommodating the liquid cooling device 6. Moreover, when the liquid cooling device 6 is plugged into the accommodating space, the elastic fastener 7 is apart from the liquid cooling tube 60 of the liquid cooling device 6. Since the structure of the liquid cooling device 6 is the same as that of the first embodiment, it is not redundantly described hereinafter. In this embodiment, the fixing methods between the elastic fastener 7 and the casing assembly 5 are the same as that of the previous embodiment. Accordingly, by extending a part of an end of the elastic fastener 7 between the liquid cooling device 6 and the casing assembly 5, the liquid cooling device 6 is fixedly disposed on the casing assembly 5, and the protrusion (not shown in figures) disposed on the bottom surface of the liquid cooling device 6 is also correspondingly accommodated within the opening 50c of the top plate 50 of the casing assembly 5. Therefore, the disadvantages of time-consuming and requiring manual assistance of the welding process can be avoided, and the convenience of installation is improved. In some embodiments, the elastic fastener 7 may also be fixed on the casing assembly 5 or independent from the casing assembly 5 and the liquid cooling device 6, which is not limited thereto.

Figure 8:
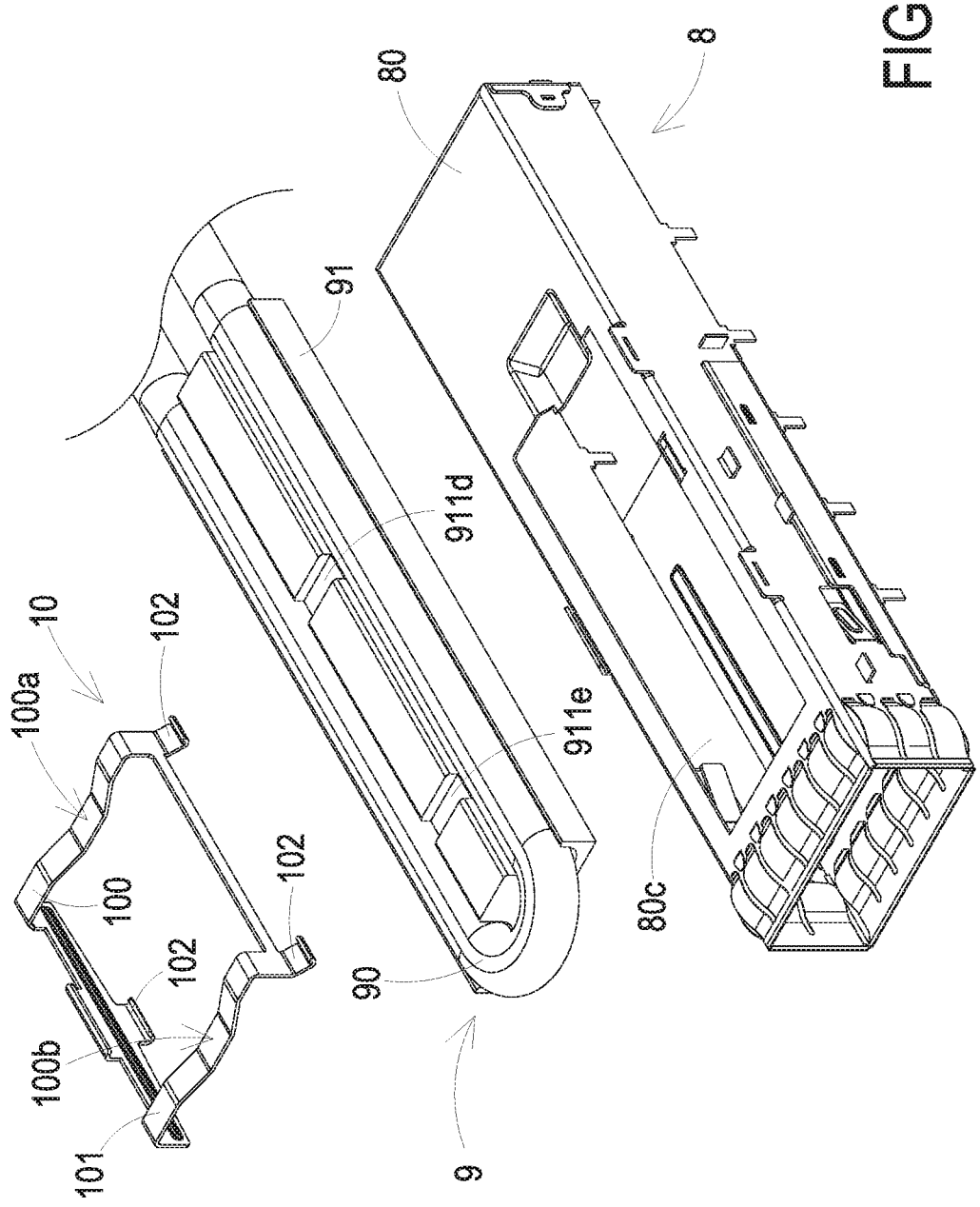
FIG. 8 is a schematic exploded view illustrating a liquid cooling device, a casing assembly and an elastic fastener of a heat dissipation module for optical transceiver according to a third embodiment of the present disclosure.

Please refer to FIG. 8. FIG. 8 is a schematic exploded view illustrating a liquid cooling device, a casing assembly and an elastic fastener of a heat dissipation module for optical transceiver according to a third embodiment of the present disclosure. In the third embodiment, the heat dissipation module for optical transceiver 1b also includes a casing assembly 8 and an elastic fastener 10, which are structurally similar to that of the first embodiment, and are not redundantly described hereinafter. The difference from the first embodiment of FIG. 1 is that the heat dissipation module for optical transceiver 1b includes a heat dissipation device 9. In some embodiments, the heat dissipation device 9 is at least one of a heat dissipation device having a heat sink, a heat dissipation device having a liquid cooling tube, a heat dissipation device having a heat pipe and a heat dissipation device having a vapor chamber, but not limited thereto. For the convenience of description, this embodiment takes the heat dissipation device 9 with liquid cooling tubes as an example for description. In this embodiment, the heat dissipation device 9 includes multiple components or an integrated structure. The elastic fastener 10 of the third embodiment is an independent structure, which can be removable from the casing assembly 8 and the heat dissipation device 9.

In this embodiment, the heat dissipation device 9 of the heat dissipation module for optical transceiver 1b can be fixed on the casing assembly 8 in the pluggable manner. First of all, the elastic fastener 10 is fixed on the casing assembly 8, and an accommodating space is defined therebetween. The heat dissipation device 9 including the liquid cooling tube 90 and the base 91 slides and inserts into the accommodating space, so that the heat dissipation device 9 is fastened on the casing assembly 8 by the elastic fastener 10. The assembling method is similar to that of the previous embodiment and is not redundantly described hereinafter.

In addition, the heat dissipation device 9 also can be fastened by another manner, which is to extend a part of an end of the elastic fastener 10 between the heat dissipation device 9 and the casing assembly 8. First, the heat dissipation device 9 is disposed on the casing assembly 8, wherein the protrusion (not shown in figures) of the heat dissipation device 9 is correspondingly accommodated within the opening 80c of the top plate 80. Then, the elastic fastener 10 is installed on the casing assembly 8, and the first downwardly-curved portion 100a of the first arm 100 and the second downwardly-curved portion 101a of the second arm 101 of elastic fastener 10 are positioned within the first positioning recess 911d and the second positioning recess 911e, respectively, so that the heat dissipation device 9 can be fastened on the casing assembly 8 by the elastic fastener 10 accordingly. The heat dissipation module for optical transceiver 1b of this embodiment is not limited to the above assembling methods, and can be adjusted according to the practical requirements. In this embodiment, the elastic fastener 10 further includes a plurality of fixing parts 102. The plurality of fixing parts 102 are used for detachably installing the elastic fastener 10 on the casing assembly 8 respectively, so as to fasten the heat dissipation device 9 on the casing assembly 8. In this embodiment, the plurality of fixing parts 102 of the elastic fastener 10 are disposed between the heat dissipation device 9 and the casing assembly 8.

Figure 9:
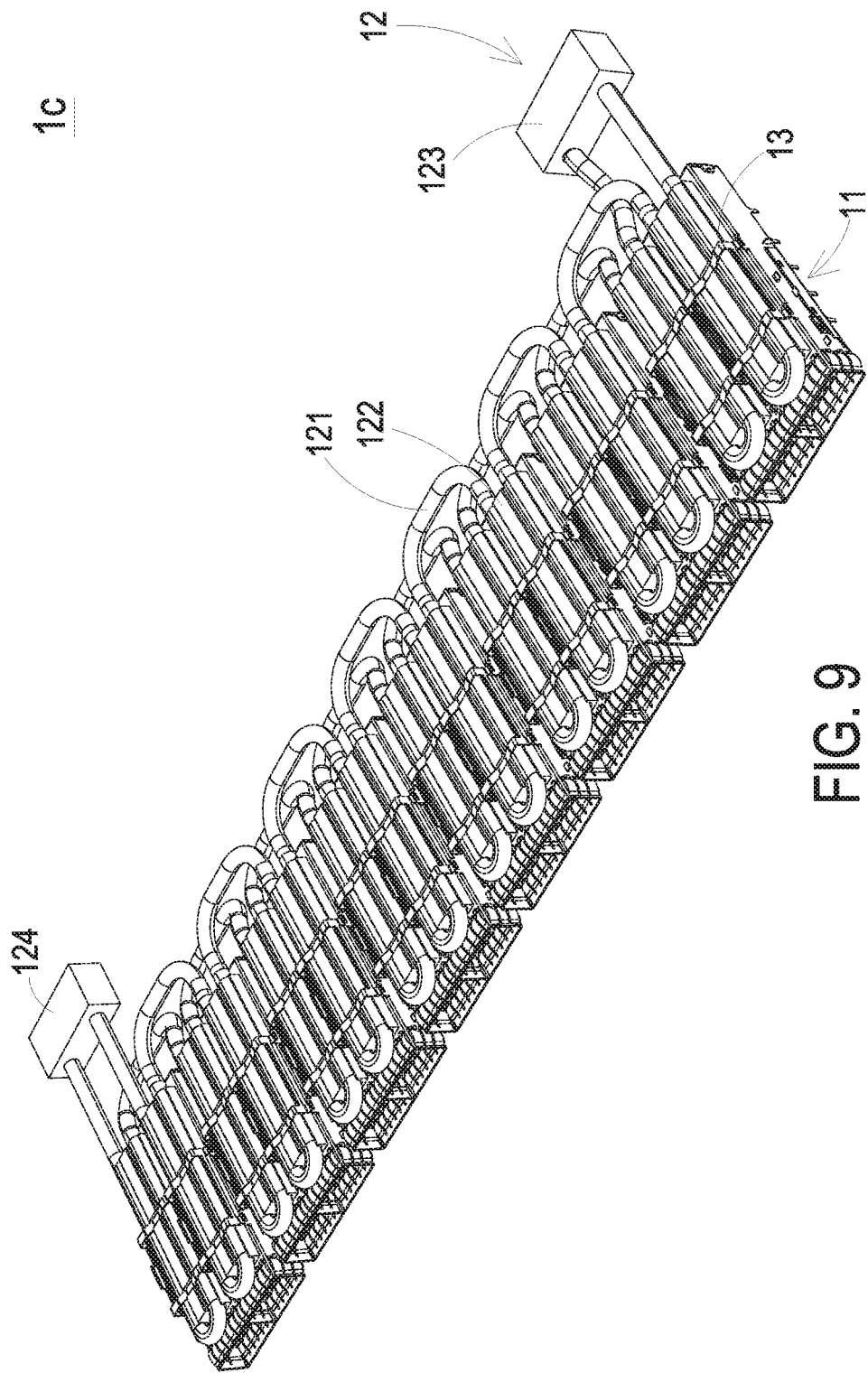
FIG. 9 is a schematic perspective view illustrating a heat dissipation module for optical transceiver according to a fourth embodiment of the present disclosure.
Figure 10:
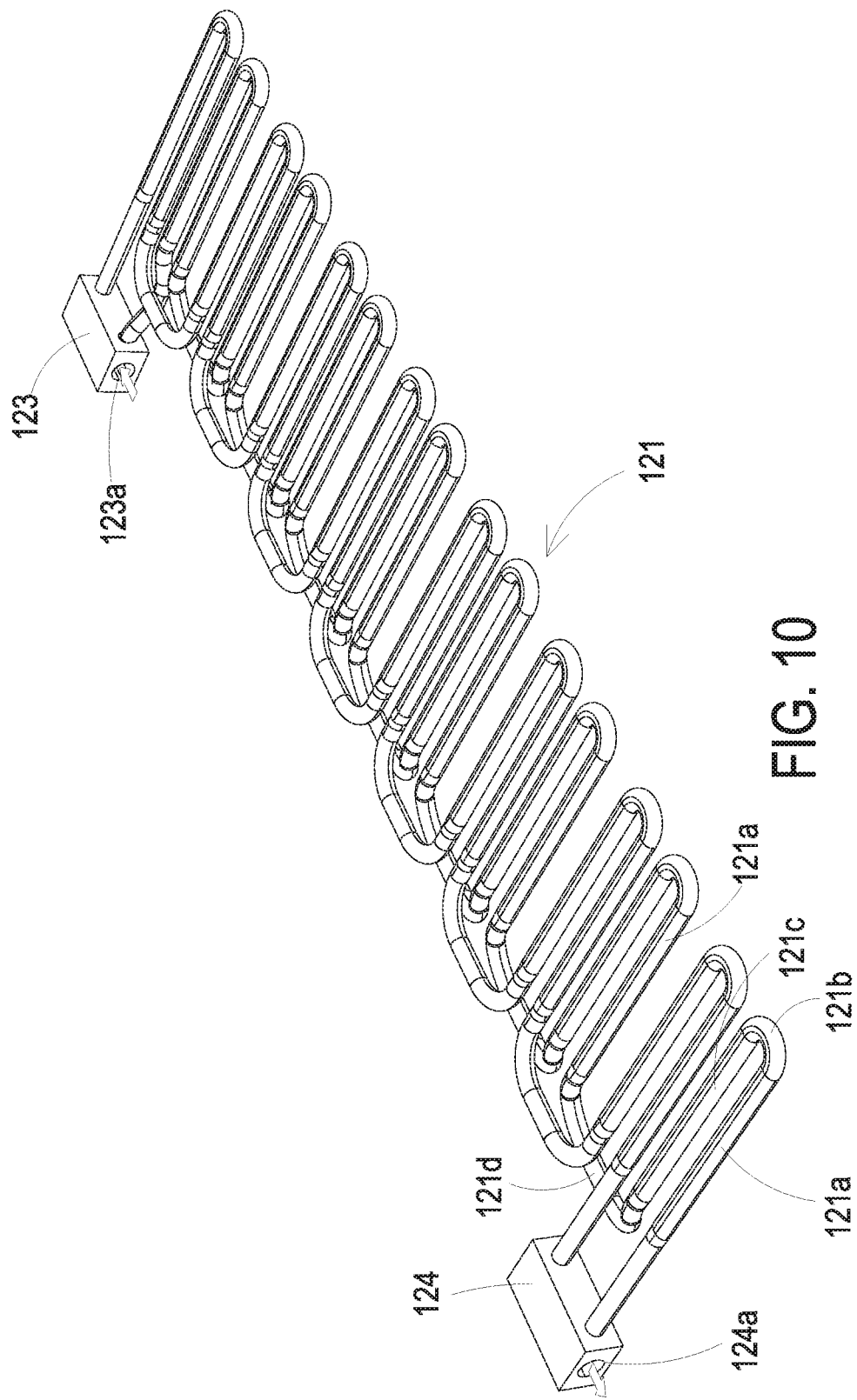
FIG. 10 is a schematic perspective view illustrating a liquid cooling device of the heat dissipation module for optical transceiver of FIG. 9.

Please refer to FIGS. 9 and 10. FIG. 9 is a schematic perspective view illustrating a heat dissipation module for optical transceiver according to a fourth embodiment of the present disclosure. FIG. 10 is a schematic perspective view illustrating a liquid cooling device of the heat dissipation module for optical transceiver of FIG. 9. In the fourth embodiment, the structure of the heat dissipation module for optical transceiver 1c is similar to that of the first embodiment and is not redundantly described hereinafter. The difference from the first embodiment is that the heat dissipation module for optical transceiver 1c includes a plurality of casing assemblies 11, a liquid cooling device 12 and a plurality of elastic fasteners 13. The plurality of casing assemblies 11 are arranged side by side. The liquid cooling device 12 includes a liquid cooling tube 121, a plurality of bases 122, an inlet portion 123 and an outlet portion 124. The liquid cooling tube 121 is in connection between the inlet portion 123 and the outlet portion 124. The inlet portion 123 has an inlet 123a. The outlet portion 124 has an outlet 124a. The liquid cooling tube 121 is in fluid communication between the inlet 123a and the outlet 124a. A cooling liquid flows into the liquid cooling tube 121 from the inlet 123a, and then flows out via the outlet 124a, so as to achieve the circulation of the cooling liquid. The liquid cooling device 12 is fastened on the casing assemblies 11 by the plurality of elastic fasteners 13, so that the liquid cooling device 12 can directly or indirectly contact with the plurality of optical components or electronic components (not shown) disposed in the plurality of casing assemblies 11. Consequently, the liquid-cooling heat dissipation is performed to the plurality of optical components or electronic components. Therefore, the disadvantages of time-consuming and requiring manual assistance of the welding process can be avoided, and the convenience of installation is improved.

In the fourth embodiment, the liquid cooling tube 121 includes a plurality of first linear parts 121a, a plurality of curved parts 121b, a plurality of second linear parts 121c and a plurality of connecting parts 121d. The first linear parts 121a, the curved parts 121b, the second linear parts 121c and the connecting parts 121d are in fluid communication with each other sequentially. Each of the curved parts 121b is in fluid communication between the adjacent first linear part 121a and the adjacent second linear part 121c, and each of the first linear parts 121a and the second linear parts 121c are parallel to each other. Each of the connecting parts 121d is in fluid communication between the adjacent first linear part 121a and the adjacent second linear part 121c, and the connecting parts 121d are disposed on the side opposite to the curved parts 121b. In this fourth embodiment, the first linear parts 121a and the second linear parts 121c are respectively disposed on the plurality of bases 122, so as to avoid the displacement or falling of the liquid cooling tube 121 during the assembling process.

From above description, a heat dissipation module for optical transceiver is disclosed and includes a liquid cooling device, a casing assembly and an elastic fastener. The liquid cooling device is fastened on the casing assembly by the elastic fastener, so as to achieve the advantage of rapid installation, and the disadvantages of time-consuming and requiring manual assistance of prior art can also be avoided. In addition, the casing assembly of the heat dissipation module for optical transceiver includes an opening, the protrusion of the liquid cooling device can be correspondingly accommodated within the opening of the casing assembly, so that the liquid cooling device can be closer to or directly in contact with the electronic components or optical components inside the casing assembly, and the efficacy of enhancing heat dissipation is achieved.

While the disclosure has been described in terms of what is presently considered to be the most practical and preferred embodiments, it is to be understood that the disclosure needs not be limited to the disclosed embodiment.

What is claimed is:

1. A heat dissipation module for an optical transceiver, comprising:
   a liquid cooling device comprising a liquid cooling tube and a base, wherein the liquid cooling tube is in connection with the base, wherein the base comprises a partition and two accommodating slots, the partition is disposed between the two accommodating slots, the liquid cooling tube is respectively disposed in the two accommodating slots, the partition comprises at least one positioning recess, and an elastic fastener is disposed in the at least one positioning recess;
   a casing assembly comprising a top plate, wherein the top plate comprises a top surface, a bottom surface and an opening, and the opening is through the top surface and the bottom surface, wherein at least one part of the liquid cooling device is extended into the opening and protruded over the bottom surface; and
   the elastic fastener configured for fastening the liquid cooling device on the casing assembly, wherein the liquid cooling device is pluggable fastened to the casing assembly.

2. The heat dissipation module for the optical transceiver according to claim 1, wherein the elastic fastener is fixed on the casing assembly or the liquid cooling device.

3. The heat dissipation module for the optical transceiver according to claim 1, wherein the elastic fastener is an independent element, and is removable from the casing assembly and the liquid cooling device.

4. The heat dissipation module for the optical transceiver according to claim 1, wherein a part of an end of the elastic fastener is disposed between the casing assembly and the liquid cooling device.

5. The heat dissipation module for the optical transceiver according to claim 1, wherein the elastic fastener is apart from the liquid cooling tube.

6. The heat dissipation module for the optical transceiver according to claim 1, wherein the base comprises multiple components or a single element.

7. The heat dissipation module for the optical transceiver according to claim 1, wherein the liquid cooling tube has two linear parts and a curved part, the curved part is connected between the two linear parts, and the two linear parts are parallel to each other.

8. A heat dissipation module for an optical transceiver, comprising:
   a liquid cooling device comprising a liquid cooling tube and a base, wherein the liquid cooling tube is in connection with the base, wherein the base comprises a partition and two accommodating slots, the partition is disposed between the two accommodating slots, the liquid cooling tube is respectively disposed in the two accommodating slots, the partition comprises at least one positioning recess, and an elastic fastener is disposed in the at least one positioning recess;
   a casing assembly comprising a top plate, wherein the top plate comprises a top surface, a bottom surface and an opening, and the opening is through the top surface and the bottom surface, wherein at least one part of the liquid cooling device is extended into the opening and protruded over the bottom surface; and
   the elastic fastener, wherein a part of an end of the elastic fastener is extended to the liquid cooling device, so as to fasten the liquid cooling device on the casing assembly.

9. The heat dissipation module for the optical transceiver according to claim 8, wherein the elastic fastener is fixed on the liquid cooling device or the casing assembly.

10. The heat dissipation module for the optical transceiver according to claim 8, wherein the elastic fastener is an independent element, and is removable from the casing assembly and the liquid cooling device.

11. The heat dissipation module for the optical transceiver according to claim 8, wherein the elastic fastener is apart from the liquid cooling tube.

12. The heat dissipation module for the optical transceiver according to claim 8, wherein the base comprises multiple components or a single element.

13. The heat dissipation module for the optical transceiver according to claim 8, wherein the liquid cooling tube has two linear parts and a curved part, the curved part is connected between the two linear parts, and the two linear parts are parallel to each other.

14. A heat dissipation module for an optical transceiver, comprising:
   a heat dissipation device comprising a base and a cooling module that is at least one of a heat sink, a liquid cooling tube, a heat pipe, and a vapor chamber, wherein the base comprises a partition and two accommodating slots, the partition is disposed between the two accommodating slots, wherein the cooling module is respectively disposed in the two accommodating slots, wherein the partition comprises at least one positioning recess, and an elastic fastener is disposed in the at least one positioning recess;
   a casing assembly comprising a top plate, wherein the top plate comprises a top surface, a bottom surface and an opening, and the opening is through the top surface and the bottom surface, wherein at least one part of the heat dissipation device is extended into the opening and protruded over the bottom surface; and
   the elastic fastener,
   wherein the heat dissipation device is pluggable fastened to the casing assembly.

15. The heat dissipation module for the optical transceiver according to claim 14, wherein a part of an end of the elastic fastener is disposed between the heat dissipation device and the casing assembly.

16. The heat dissipation module for the optical transceiver according to claim 14, wherein the heat dissipation device comprises multiple components or a single element.

17. The heat dissipation module for the optical transceiver according to claim 14, wherein the elastic fastener comprises a fixing part, the fixing part of the elastic fastener is detachably installed on the casing assembly, so that the heat dissipation device is fastened on the casing assembly.

* * * * *